United States Patent
Kenig et al.

(10) Patent No.: US 9,252,731 B2
(45) Date of Patent: Feb. 2, 2016

(54) PASSIVE PHASE NOISE CANCELLATION ELEMENT

(71) Applicant: CALIFORNIA INSTITUTE OF TECHNOLOGY, Pasadena, CA (US)

(72) Inventors: Eyal Kenig, Los Angeles, CA (US); Michael C. Cross, Arroyo Grande, CA (US); Ron Lifshitz, Kfar Saba (IL); Rassul Karabalin, Los Angeles, CA (US); Luis Guillermo Villanueva Torrijo, Naerum (DK); Matthew Matheny, Diamond Bar, CA (US); Michael L. Roukes, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 114 days.

(21) Appl. No.: 14/155,018

(22) Filed: Jan. 14, 2014

(65) Prior Publication Data
US 2014/0320219 A1 Oct. 30, 2014

Related U.S. Application Data

(60) Provisional application No. 61/752,242, filed on Jan. 14, 2013.

(51) Int. Cl.
*H03H 1/00* (2006.01)
(52) U.S. Cl.
CPC ..................................... *H03H 1/00* (2013.01)
(58) Field of Classification Search
CPC .................................. H03L 7/02; H03H 1/00
USPC .......... 331/35, 47, 116 R, 154, 158; 329/300, 329/344
See application file for complete search history.

(56) References Cited

U.S. PATENT DOCUMENTS

| 5,839,062 | A  | * | 11/1998 | Nguyen et al. | ............... | 455/323 |
| 8,058,940 | B1 | * | 11/2011 | Quevy | .......................... | 331/154 |
| 8,497,747 | B1 | * | 7/2013 | Wojciechowski et al. | ..... | 333/186 |
| 2005/0046505 | A1 | | 3/2005 | Gomez | | |
| 2011/0102095 | A1 | * | 5/2011 | Steeneken et al. | ............ | 332/175 |
| 2012/0299651 | A1 | | 11/2012 | Goel et al. | | |

OTHER PUBLICATIONS

Demir, A. et. al., "Phase Noise in Oscillators: a Unifying Theory and Numerical Methods for Characterization", Circuits and Systems I: fundamental Theory and Applications, IEEE Transactions, vol. 47, No. 5, pp. 655-674 (2000).

(Continued)

*Primary Examiner* — Jeffrey Shin
(74) *Attorney, Agent, or Firm* — The Marbury Law Group, PLLC (57) ABSTRACT

A passive electro-mechanical device that reduces phase noise in oscillators, thereby improving their frequency precision. The noise reduction device can consist of a pair of coupled nonlinear resonators that are driven parametrically—by modulating their natural frequency in time, through the output signal of a conventional oscillator at a frequency close to the sum of the linear mode frequencies. Above the threshold for parametric response, the coupled resonators can exhibit oscillation at an inherent frequency. The novel possibility for noise elimination is realized by tuning the system to operating points for which this periodic signal is immune to frequency noise in the drive signal, providing a way to clean the phase noise of the driving oscillator.

14 Claims, 7 Drawing Sheets

(56) References Cited

OTHER PUBLICATIONS

Drummond, P.D. et al., "Correlations in nondegenerate parametric oscillation. II. Below threshold results", *Phys. Rev. A*, vol. 41, pp. 3930-3949, (1990).

Graham, R., "Theory of Cross-Correlation of Signal and Idler in Parametric Oscillators," *Phys. Lett. A*, vol. 32, No. 6, pp. 373-374, (1970).

Greywall et al., "Evading Amplifier Noise in Nonlinear Oscillators," *Phys. Rev. Lett.*, 72, 19, 2992-2995, (1994).

Karabalin, R.B. et al., "Nonlinear dynamics and chaos in two coupled nanomechanical resonators," *Phys. Rev. B*, vol. 79, No. 16, p. 165309, (2009).

Kenig, et al., "Passive Phase Noise Cancellation Scheme," *Phys. Rev. Lett.*, PRL 108, 264102 (2012).

Kroll, N.M., "Parametric amplification in spatially extended media and application to the design of tuneable oscillators at optical frequencies" Phys. Rev. , vol. 127, pp. 1207-1211 (1962).

Lax, M., "Classical noise v. noise in self-sustained oscillators", Phys. Rev. , vol. 160, pp. 290-307 (1967).

Lifshitz, R. et al., "Nonlinear Dynamics of Nanomechanical and Micromechanical Resonators," in *Review of Nonlinear Dynamics and Complexity* (H.G. Schuster, ed.), vol. 1 (Meinheim), pp. 1-52, Wiley, (2008).

Reid, M.D. et al., "Correlations in nondegenerate parametric oscillation: Squeezing in the presence of phase diffusion", *Phys. Rev. A.* vol. 40, pp. 4493-4506, (1989).

Sanders, B.C. et al., "Quantum-noise reduction in intracavity four-wave mixing", *Phys. Rev. A*, vol. 42, pp. 6767-6773, (1990).

Slosser, J.J. et al., "Noise reduction in the nondegenerate parametric oscillator with direct detection feedback", *Phys. Rev. A.*, vol. 50, pp. 793-800, (1994).

Wong, N.C., "Optical frequency division using an optical parametric oscillator", Opt. Lett. vol. 15, No. 20, pp. 1129-1131 (1990).

Yurke et al., "Theory of amplifier-noise evasion in an oscillator employing a nonlinear resonator," *Phys. Rev. A*, vol. 51, pp. 4211-4229, (1995).

\* cited by examiner

PASSIVE PHASE NOISE CANCELLATION ELEMENT

RELATED APPLICATIONS

This application claims priority to U.S. provisional application Ser. No. 61/752,242 filed Jan. 14, 2013, the complete disclosure of which is incorporated by reference herein for all purposes.

STATEMENT OF FEDERAL SUPPORT

This invention was made with government support under FA8650-10-1-7029 awarded by US Air Force (USAF/ESC). The government has certain rights in the invention.

BACKGROUND

Self-sustained oscillators frequently appear as crucial elements in the electrical devices that surround us in our highly technological environment. Essentially, oscillators are devices generating a periodic signal at an inherent frequency, so their primary function is to provide a time reference (clock) or frequency reference. An ideal self-sustained oscillator is mathematically described as a limit cycle in the phase space of dynamical variables, or equivalently as a periodic solution of a set of autonomous differential equations. The ideal oscillator can be described in terms of a steadily increasing phase variable corresponding to the phase space point advancing around the limit cycle, with a $2\pi$-phase change corresponding to a period of the motion. This phase is highly sensitive to additional stochastic terms (noise) in the equations of motion, as the appearance of periodicity without an external time reference implies the freedom to drift in the phase direction. In the power spectrum of the oscillator output the stochastic phase dynamics lead to a broadening of the spectral peaks, that are perfectly discrete in the ideal case [see M. Lax, *Phys. Rev.*, vol. 160, pp. 290-307, 1967; A. Demir et al., "Phase Noise in Oscillators: a Unifying Theory and Numerical Methods for Characterization," *Circuits and Systems I: Fundamental Theory and Applications, IEEE Transactions* on, vol. 47, no. 5, pp. 655-674, 2000], and a degradation of the performance as a time or frequency reference. Thus, an essential task in the design of a good oscillator is to reduce the effects of the noise present in the system on the oscillator phase. See, for example, Greywall et al., "Evading Amplifier Noise in Nonlinear Oscillators," *Phys. Rev. Lett.*, 72, 19, 2992-2995, (1994).

Oscillator phase noise is described in, for example, US Patent Publication Nos. 2005/0046505 and 2012/0299651.

SUMMARY

Methods, devices, and systems are described herein. Briefly, in its various embodiments, a passive "noise cleaning" device is described and claimed herein that reduces, or even eliminates, the noise in the output of an oscillator. The noise cleaning device is made of a pair of coupled resonators that are driven parametrically with a noisy frequency (from the oscillator's output) near the sum of their linear mode frequencies. It produces a signal with reduced noise at a frequency near the difference of these linear frequencies. The generation of a two signals, at different frequencies, by parametric excitation at the frequency sum is called non-degenerate parametric response. This phenomenon has been mostly studied in the context of optical parametric oscillators (OPOs) [see N. M. Kroll, *Phys. Rev.* vol. 127, pp. 1207-1211, August 1962; N. C. Wong, *Opt. Lett.*, vol. 15, no. 20, pp. 1129-1131, 1990]. However, it is demonstrated here that non-degenerate parametric excitation can be used to eliminate the phase noise of an oscillator.

More particularly, one embodiment provides a method for reducing phase noise in an oscillator comprising: providing a noise reduction device comprising two coupled nonlinear resonators having linear mode frequencies of $\omega_1$ and $\omega_2$ respectively; providing an oscillator which produces an output signal having a frequency around $\omega_1+\omega_2$ and having a phase noise; parametrically driving the coupled nonlinear resonators with the oscillator signal to induce a non-degenerate response with an output signal at a frequency $\omega_1-\omega_2$; wherein the phase noise of the oscillator output signal is reduced or eliminated in the output signal of the non-degenerate response.

In one embodiment, the parametrically driving step is carried out by feeding the oscillator signal into a pair of electrodes, and incorporating a piezoelectric material in the resonators themselves, so that the time-varying voltage produced by the electrodes is converted into mechanical stress, which in turn changes the natural frequency of the resonators in time.

In another embodiment, the parametrically driving step comprises application to each resonator individually with a relative phase of 180° between the driving signals.

In another embodiment, the resonators are beam resonators. In another embodiment, the resonators are nanomechanical or micromechanical resonators. In one embodiment, the resonators are nanomechanical resonators, whereas in another embodiment, the resonators are micromechanical resonators.

In one embodiment, the phase noise of the oscillator output signal is eliminated in the output signal of the non-degenerate response.

In one embodiment, the phase noise of the oscillator output signal is reduced in the output signal of the non-degenerate response.

In one embodiment, the output signal at a frequency $\omega_1-\omega_2$ is given by squaring and filtering.

In one embodiment, the phase noise reduction is a passive phase noise reduction.

In one embodiment, a method is provided for reducing phase noise in an oscillator comprising: providing a noise reduction device consisting of two coupled nonlinear beam resonators having linear mode frequencies of $\omega_1$ and $\omega_2$ respectively; parametrically and electromechanically driving the two coupled nonlinear beam resonators with an oscillator signal to induce a non-degenerate response with an output signal at a frequency $\omega_1-\omega_2$.

One embodiment is an electromechanical device comprising elements and circuitry adapted to carry out the methods described herein.

In one embodiment, a system is provided for reducing phase noise in an oscillator comprising: a noise reduction device comprising two coupled nonlinear resonators having linear mode frequency of $\omega_1$ and $\omega_2$ respectively; an oscillator which produces an output signal having a frequency around $\omega_1+\omega_2$ and having a phase noise; wherein the system is adapted for parametrically driving the two coupled nonlinear beam resonators with the oscillator signal to induce a non-degenerate response with an output signal at a frequency $\omega_1-\omega_2$. In one embodiment, the system is a device.

1. An electromechanical device comprising elements and circuitry adapted to carry out the method of claim 1.
2. An electromechanical device comprising elements and circuitry adapted to carry out the method of claim 12.

A seemingly unique advantage for at least some embodiments is that one does not have to manipulate the oscillator in order to achieve noise reduction. More particularly, an advantage for at least some embodiments is that the passive device can be applied externally to improve the performance of an existing oscillator without changing its internal circuitry.

A further advantage for at least some embodiments is that the "noise cleaning" devices, systems, and methods are purely passive and, hence, do not require any external source of energy.

An additional advantage for at least some embodiments is use as a research tool.

Of course, the many advantages associated with reduced or eliminated phase noise also are present. More particularly, an advantage for at least some embodiments is the suppression or elimination of noise coming from various electronic components of the oscillator systems.

Accordingly, it is expected that embodiments described and claimed herein should have broad applicability.

DETAILED DESCRIPTION

Introduction

The complete disclosure of priority U.S. provisional application Ser. No. 61/752,242 filed Jan. 14, 2013 is incorporated by reference herein for all purposes.

Embodiments described herein are also provided in the publication, Kenig, et al., "Passive Phase Noise Cancellation Scheme," *Phys. Rev. Lett.*, PRL 108, 264102 (2012) which is hereby incorporated herein by reference in its entirety for all purposes.

Figure 1:
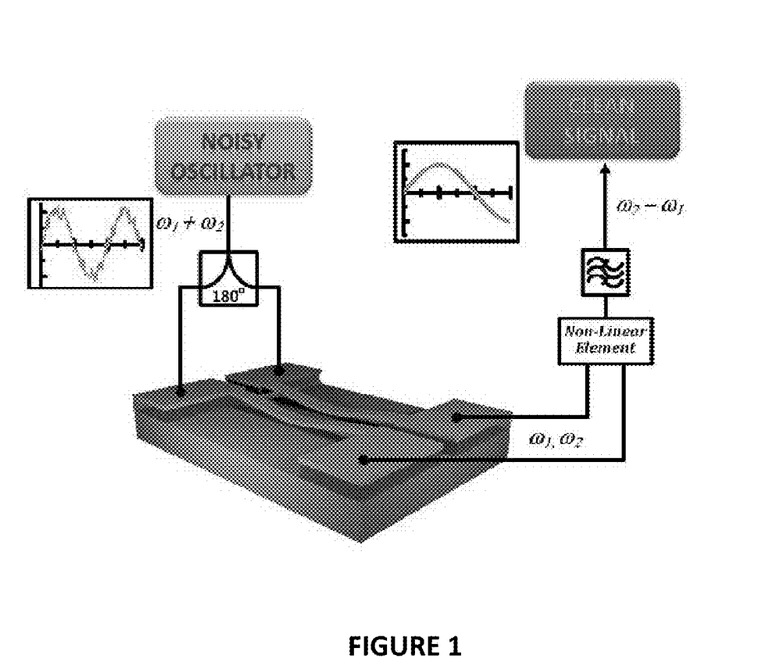
FIG. 1 shows an embodiment for the phase noise elimination scheme. An oscillator produces a signal with a noisy frequency around $\omega_1+\omega_2$. This signal parametrically drives a pair of coupled beams with a relative phase of 180° to induce a non-degenerate response. The output signal at a frequency around $\omega_1-\omega_2$ is obtained by squaring and filtering.

The presently claimed inventions are not limited to the embodiments illustrated in the figures. In one embodiment, a diagram of the noise reduction scheme is illustrated in FIG. 1.

The output signal of a noisy oscillator is used to parametrically-drive a pair of coupled beams, by modulating their natural frequency in time. This injects energy that induces oscillations, similarly to the way one could oscillate on a swing by changing the position of their center of mass [see R. Lifshitz and M. C. Cross, "Nonlinear Dynamics of Nanomechanical and Micromechanical Resonators," in *Review of Nonlinear Dynamics and Complexity* (H. G. Schuster, ed.), vol. 1 (Meinheim), pp. 1-52, Wiley, 2008]. A possible electromechanical implementation of parametric excitation is achieved by feeding the oscillator signal into a pair of electrodes, and incorporating piezoelectric material in the beams themselves, so that the time-varying voltage produced by the electrodes is converted into mechanical stress, which in turn changes the natural frequency of the resonators in time. In the current setup parametric actuation is applied to each beam individually, with a relative phase of 180° between the driving signals. The use of the 180° between the driving signals achieves maximal non-degenerate response. Smaller relative phases, greater than zero, can also be employed.

In order to apply parametric excitation, in these embodiments, the device needs to be engineered such that the frequency of the driving oscillator is close to the sum of the two frequencies associated with the two linear modes of the motion, $\omega_1+\omega_2$. Furthermore, in order for the parametric response to be non-degenerate, the difference between these frequencies, which is determined by the coupling between the beams, needs to be notable relative to their bandwidth. If this is satisfied, and certain threshold values of the controllable parameters are exceeded, the resonators are set in motion that is composed of the two modes, each oscillating at a frequency close to its linear frequency.

A key result is that non-degenerate parametric oscillations are not locked to the driving source, and that the dynamics contains a phase-translation invariance that corresponds to the existence of a limit-cycle [see R. Graham, "Theory of Cross-Correlation of Signal and Idler in Parametric Oscillators," *Phys. Lett. A*, vol. 32, no. 6, pp. 373-374, 1970; M. D. Reid et al., *Phys. Rev. A*. vol. 40, pp. 4493-4506, 1989; B. C. Sanders et al., *Phys. Rev. A*, vol. 42, pp 6767-6773, 1990; P. D. Drummond et al., *Phys. Rev. A*, vol. 41, pp. 3930-3949, 1990; and J. J. Slosser et al., *Phys. Rev. A.*, vol. 50, pp. 793-800, 1994]. As shown in the following quantitative description, as the drive frequency is swept, the limit-cycle frequency reaches a maximal value. The vanishing derivative at this maximum can be shown to correspond with making the output signal at frequency around $\omega_1-\omega_2$ completely resistant to noise in the drive frequency. This provides a way to clean the phase noise of the driving oscillator.

QUANTITATIVE DESCRIPTION

Figure 2:
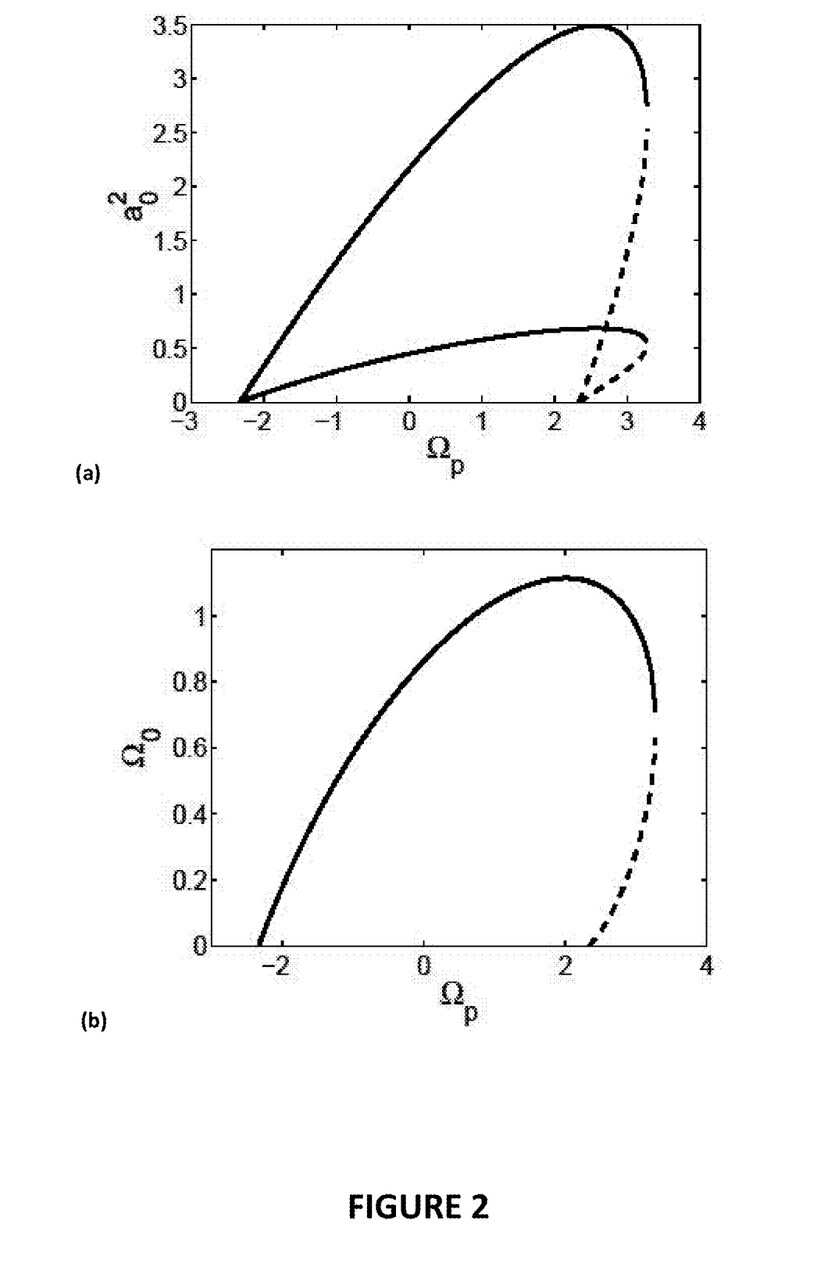
FIG. 2 shows in one embodiment the circular periodic solutions of Eqs. (2): (a) The squared mode amplitudes (the in-phase mode has the larger amplitude): (b) Twice the frequency of the periodic solutions. Solid and dashed lines are stable and unstable solutions, respectively. The parameters are: $\Delta=7$, $g=10$, $\eta=1$.

We initiate the quantitative description of the device by analyzing the mathematical model for a pair of coupled resonators, like the ones noted in FIG. 1. The dimensionless equations for the deviations $x_n$ from the equilibrium positions of the beams are (R. Lifshitz and M. C. Cross, "Nonlinear dynamics of nanomechanical and micromechanical resonators," in *Review of Nonlinear Dynamics and Complexity* (H. G. Schuster, ed.), vol. 1. (Meinheim), pp. 1-52, Wiley, 2008; R. B. Karabalin, M. C. Cross, and M. L. Roukes, "Nonlinear dynamics and chaos in two coupled nanomechanical resonators," *Phys. Rev. B*, vol. 79, no. 16, p. 165309, 2009).

$$\ddot{x}_n+x_n+x_n^3+\epsilon\dot{x}_n+\eta x_n^3\dot{x}_n+\epsilon h_n x_n \cos(\omega_p t)+\Delta(x_n-x_k)=0, \quad (1)$$

for n, k=1, 2. The resonators are taken to be identical, having the resonant frequency $\omega_0$ that was scaled out of these equations. Note that each resonator is parametrically excited with a drive amplitude $h_n$ and that the nonlinearity of the resonator originates from both the elastic restoring force and damping mechanism. We consider the linear damping to be weak, $\epsilon \ll 1$ ($1/\epsilon$ is the quality factor of the resonator), so correspondingly a small drive amplitude is sufficient excite the resonators. In this regime, we can focus on the slow-time modulation of the basic oscillatory motion described by a pair of complex equations for the amplitudes of the modes of motion [R. Lifshitz and M. C. Cross, "Nonlinear dynamics of nanomechanical and micromechanical resonators," in *Review of Nonlinear Dynamics and Complexity* (H. G. Schuster, ed.), vol. 1. (Meinheim), pp. 1-52, Wiley, 2008]

$$\frac{dA_1}{dT} = -\frac{1}{2}(1+i\Omega_p)A_1 + i\frac{g}{4\omega_1}A_2^* + \frac{3i-\eta\omega_1}{8\omega_1}(|A_1|^2 A_1 + 2|A_2|^2 A_1), \quad (2a)$$

$$\frac{dA_2}{dT} = -\frac{1}{2}(1+i\Omega_p)A_2 + i\frac{g}{4\omega_2}A_1^* + \frac{3i-\eta\omega_2}{8\omega_2}(|A_2|^2 A_2 + 2|A_1|^2 A_2), \quad (2b)$$

where $\omega_1^2=1$ and $\omega_2^2=1+2\Delta$ are the linear frequencies of the in-phase and out-of-phase modes, respectively, $\epsilon\Omega_p=\omega_p-\omega_1-\omega_2$ is the small difference between the drive frequency and the sum of the linear mode frequencies, $T=\epsilon t$ is the slow time scale, and $g=(h_1-h_2)/2$ [Note that the 180□ phase shift performed on the oscillator output makes $h_1=-h_2$.]. Upon transforming to magnitude-phase coordinates, $A_n=a_n e^{i\Phi_n}$, it is possible to find the amplitudes and frequency of the periodic solutions of Eqs. (2), which are shown in FIG. 2 as a function of the drive frequency for a particular choice of the other parameters. For example the coupling $\Delta=7$, corresponds physically to a linear mode splitting equal to $\sqrt{1+2\Delta}-1 \cong 2.87$ times the resonant frequency.

We now demonstrate how the dynamics can be utilized to eliminate the phase noise of the driving oscillator. We model this noise as white noise of intensity $F_{\Omega_p}$ in the frequency of the drive $(\Omega_p \rightarrow \Omega_p + \Xi_p(T), \langle \Xi_p(T)\Xi_p(T') \rangle = F_{\Omega_p}\delta(T-T'))$. This noise causes the phase of the driving source to diffuse as $\langle [\Phi_p(T+\tau)-\Phi_p(T)]^2 \rangle = F_{\Omega_p}|\tau|$ The noise $\Xi_p$ induces perturbations to the phase difference $\Psi=\phi_1-\phi_2$ which we note as $\psi$; these can be calculated by solving the linearized polar amplitude equations spectrally, as was done by Yurke et al., "Theory of amplifier-noise evasion in an oscillator employing a nonlinear resonator," *Phys. Rev. A*, vol. 51, pp. 4211-4229, 1995, or using the method of Demir et al, Circuits and Systems I: Fundamental Theory and Applications, *IEEE Transactions on*, vol. 47, no. 5, pp. 655-674, 2000. This gives diffusion of the phase of the output signal, with the variance of the phase difference growing linearly in time $$\langle [\psi(T+\tau)-\psi(T)]^2 \rangle = D_{\Omega_p} F_{\Omega_p} |\tau| \quad (3)$$

with the constant $D_{\Omega_p}$ quantifying the intrinsic phase sensitivity to drive frequency noise. This expression applies in the limit that the time $\tau$ is much longer than the decay time onto the limit cycle for the no-noise oscillator. This approximation corresponds to frequency offsets close to the oscillator frequency. This is the relevant regime to explore since the width of the oscillator spectral peak is typically narrower than for the driven resonator, where the width is determined by the quality factor, which in turn sets the decay time. The phase diffusion induced by white drive frequency noise corresponds to a Lorenzian spectral peak with width $D_{\Omega_p} F_{\Omega_p}$ times the resonator line width $\epsilon\omega_0$. Equation (3) is the expected result because after transients have decayed and the system has settled onto the limit cycle, the net effect of the stochastic dynamics is a Brownian motion of the free phase.

Figure 3:
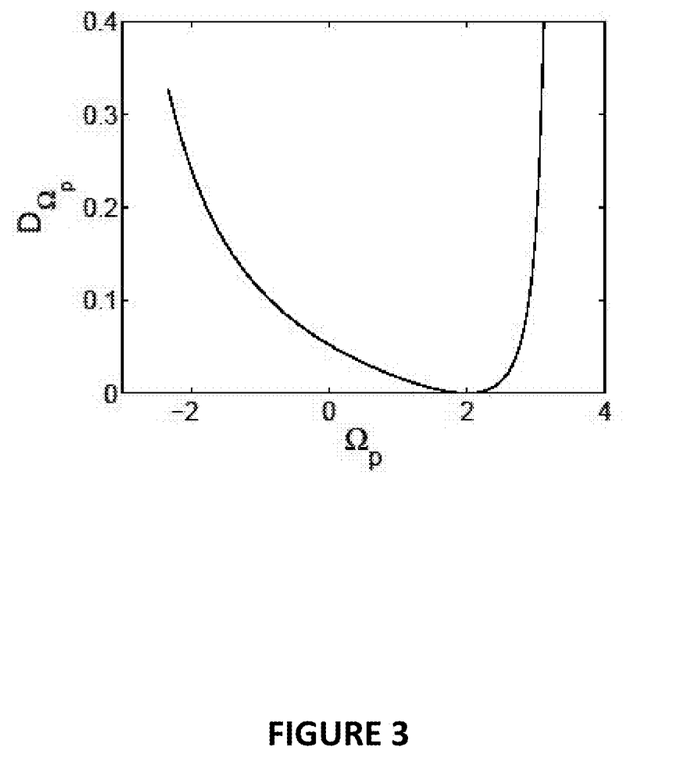
FIG. 3 shows in one embodiment the phase diffusion induced by frequency noise of unit strength. The phase diffusion coefficient is zero around $\Omega_p \approx 2$, and it is also smaller than the phase diffusion of the driving oscillator along most of the curve. The curve can be calculated as the squared derivative of the solid curve in FIG. 2(b).

Since we are concerned with the long time phase diffusion, the coefficient $D_{\Omega_p}$ can also be calculated by examining the effect an infinitesimal stationary perturbation in $\Omega_p$ has on the oscillation frequency $\Omega_o$, by linearizing the algebraic polar amplitude equations that determine the fixed points and oscillation frequency $\Omega_o$. Comparing with the expression for the phase diffusion we find $D_{\Omega_p}=(d\Omega_o/d\Omega_p)^2$. Therefore, to reduce the frequency stability degradation due to noise in the drive frequency we are interested in operating at the maximum shown in FIG. 2(*b*). By doing this, the effect of drive frequency noise on the phase diffusion is eliminated, and the corresponding frequency spectrum is narrowed (to a sharp peak in the absence of other noise terms). It is also noteworthy that for the parameters used to plot the diffusion coefficient $D_{\Omega_p}$ in FIG. 3, the frequency stability is also improved along most of the curve, since $D_{\Omega_p}<1$ (output frequency noise less than input frequency noise), indicating that this passive device is broadly applicable to enhance the performance of existing oscillator designs.

WORKING EXAMPLES

Figure 4:
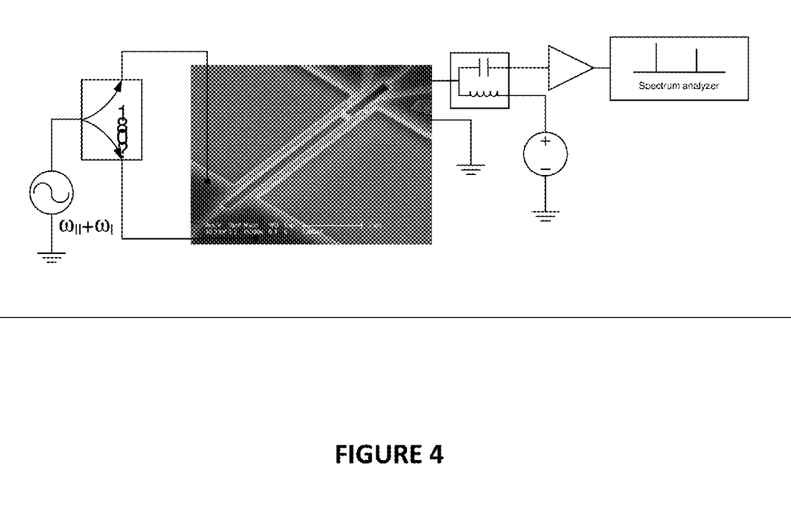
FIG. 4 shows a working example embodiment and schematic, further to FIG. 1.
Figure 5:
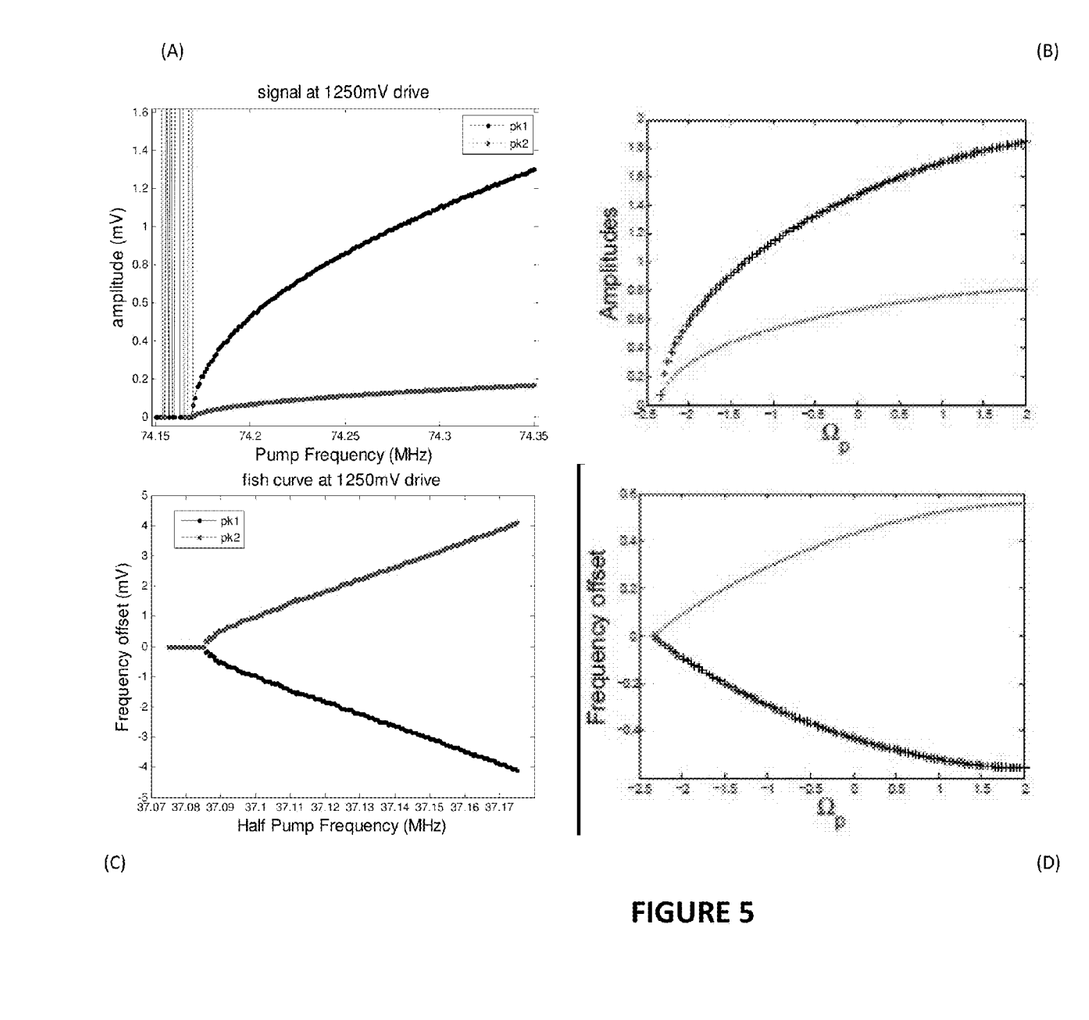
FIGS. 5A, 5B, 5C, and 5D show in one embodiment the amplitude of the two modes as a function of the drive frequency (top, FIG. 5A), and the difference between each mode frequency and the frequency at onset, as a function of half the drive frequency (bottom, FIG. 5C). The left side (FIGS. 5A and 5C) is the experimental measurements and the right side (FIGS. 5B and 5D) is the theory.

Additional embodiments are provided by the following non-limiting working examples.
Measurements of a Passive Phase Noise Cancellation Device
1. Operating in a Non-degenerate Mode
A noise reduction device was made of a pair of beams that are driven parametrically at a frequency near the sum of their linear mode frequencies, with a 180° phase shift between them. See FIG. 4. The motion is detected and analyzed spectrally. In FIG. 4, at the left is schematically shown an oscillator with a frequency around $\omega_1+\omega_2$. This is passed into a power splitter that provides out-of-phase excitation to the electrodes of two coupled anharmonic mechanical resonators through the piezoelectric effect. The coupled beam motion is detected piezoresistively at the other end. A voltage source provides a bias to transduce the time-varying changes in resistance arising from beam motion.

The response is composed of the two modes of motion and exhibits non-degenerate response. The FIGS. 5A, 5B, 5C, and 5D show the amplitude of the two modes as a function of the drive frequency (top, FIG. 5A), and the difference between each mode frequency and the frequency at onset, as a function of half the drive frequency (bottom, FIG. 5C). Left side (FIGS. 5A and 5C) is the experimental measurements and the right side (FIGS. 5B and 5D) is the theory.
2. Demonstration of Noise Reduction
Noise is added to the input source, and the output signal which is composed of the two frequencies is mixed and produces a signal at the frequency sum and the frequency difference. See FIG. 6. More particularly, a noise source is added at the device input, complementing the signal provided by the oscillator. A nonlinear element at the output achieves the squaring operation and a subsequent filter eliminates all but the desired response at $\omega_1-\omega_2$. A phase noise analyzer is used to characterize the spectral purity improvement at the output. A variety of embodiments of the squaring element are possible such as, for example, nonlinear electrical circuit elements and nonlinear mechanical elements.

Figure 6:
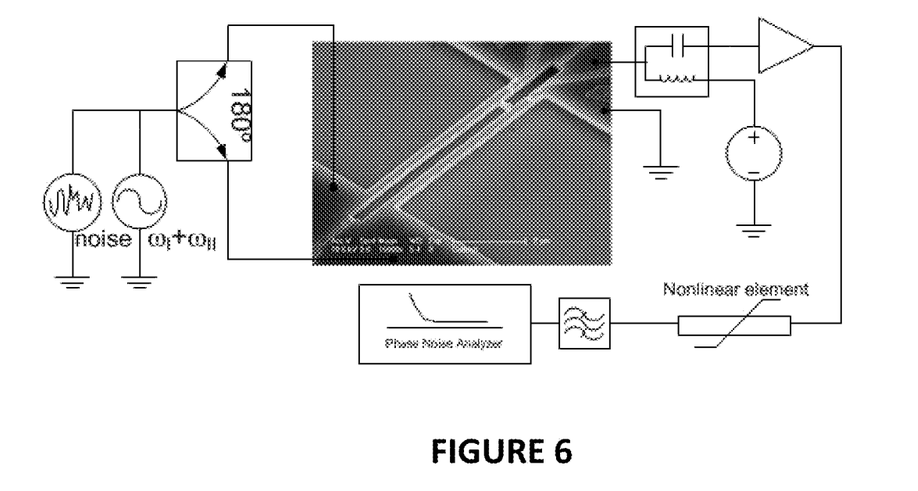
FIG. 6 shows a working example embodiment and schematic, further to FIGS. 1 and 4.
Figure 7:
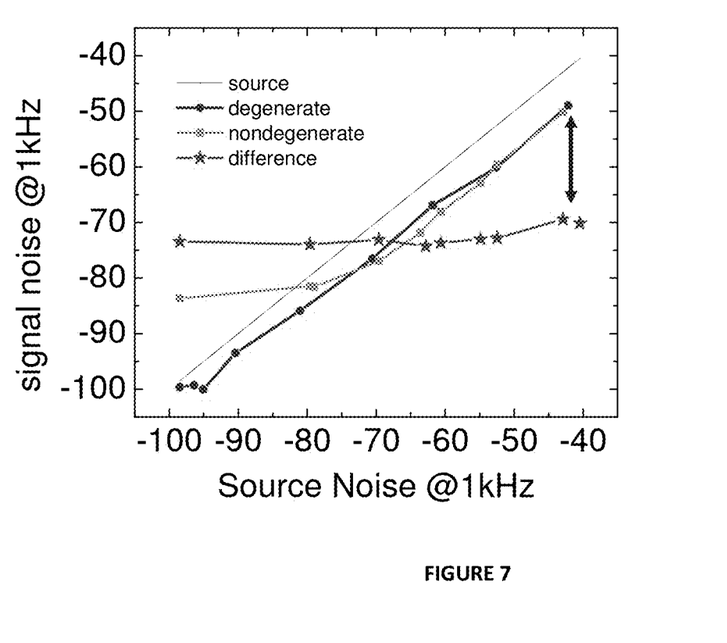
FIG. 7 illustrates an embodiment for signal noise versus source noise.

FIG. 7 illustrates the phase noise reduction achieved for the embodiment schematically depicted in FIGS. 1, 4, and 6. Output noise is shown as a function of the added noise at the input. The arrow at −40 dBc/Hz shows an improvement of 20 dB from "noise cleaning" is attained.

What is claimed is:

1. A method for reducing phase noise in an oscillator comprising:
   providing a noise reduction device comprising two coupled nonlinear resonators having linear mode frequencies of $\omega_1$ and $\omega_2$ respectively;
   providing an oscillator which produces an output signal having a frequency around $\omega_1+\omega_2$ and having a phase noise;
   parametrically driving the coupled nonlinear resonators with the oscillator signal to induce a non-degenerate response with an output signal at a frequency $\omega_1-\omega_2$;
   wherein the phase noise of the oscillator output signal is reduced or eliminated in the output signal of the non-degenerate response.

2. The method of claim 1, wherein the parametrically driving step is carried out by feeding the oscillator signal into a pair of electrodes, and incorporating a piezoelectric material in the resonators themselves, so that the time-varying voltage produced by the electrodes is converted into mechanical stress, which changes the natural frequency of the resonators in time.

3. The method of claim 1, wherein the parametrically driving step comprises application to each resonator individually with a relative phase of 180° between the driving signals.

4. The method of claim 1, wherein the resonators are beam resonators.

5. The method of claim 1, wherein the resonators are nanomechanical or micromechanical resonators.

6. The method of claim 1, wherein the resonators are nanomechanical resonators.

7. The method of claim 1, wherein the resonators are micromechanical resonators.

8. The method of claim 1, wherein the phase noise of the oscillator output signal is eliminated in the output signal of the non-degenerate response.

9. The method of claim 1, wherein the phase noise of the oscillator output signal is reduced in the output signal of the non-degenerate response.

10. The method of claim 1, wherein the output signal at a frequency $\omega_1-\omega_2$ is given by squaring and filtering.

11. The method of claim 1, wherein the phase noise reduction is a passive phase noise reduction.

12. An electromechanical device comprising elements and circuitry adapted to carry out the method of claim 1.

13. A system for reducing phase noise in an oscillator comprising:
   a noise reduction device comprising two coupled nonlinear resonators having linear mode frequency of $\omega_1$ and $\omega_2$ respectively;
   an oscillator which produces an output signal having a frequency around $\omega_1+\omega_2$ and having a phase noise;
   wherein the system is adapted for parametrically driving the two coupled nonlinear beam resonators with the oscillator signal to induce a non-degenerate response with an output signal at a frequency $\omega_1-\omega_2$.

14. The system of claim 13, wherein the system is a device.

* * * * *